(12) United States Patent
Lien

(10) Patent No.: US 6,924,995 B2
(45) Date of Patent: Aug. 2, 2005

(54) CAM CIRCUIT WITH RADIATION RESISTANCE

(75) Inventor: Chuen-Der Lien, Los Altos Hills, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 10/845,654

(22) Filed: May 13, 2004

(65) Prior Publication Data

US 2004/0208034 A1 Oct. 21, 2004

Related U.S. Application Data

(63) Continuation-in-part of application No. 10/165,506, filed on Jun. 6, 2002, now Pat. No. 6,754,093.

(51) Int. Cl.[7] .............................................. G11C 15/00
(52) U.S. Cl. ......................... 365/49; 365/149; 365/227
(58) Field of Search .......................... 365/49, 149, 226, 365/227, 228, 189.07

(56) References Cited

U.S. PATENT DOCUMENTS

| | | | |
|---|---|---|---|
| 4,506,436 A | 3/1985 | Bakeman, Jr. et al. | |
| 4,779,226 A | 10/1988 | Haraszti | |
| 4,791,606 A | 12/1988 | Threewitt et al. | |
| 4,876,215 A | 10/1989 | Hsu | |
| 5,561,429 A | 10/1996 | Halberstam et al. | |
| 5,572,460 A | 11/1996 | Lien | |
| 5,681,769 A | 10/1997 | Lien | |
| 5,900,654 A * | 5/1999 | Spratt | 257/222 |
| 6,067,656 A | 5/2000 | Rusu et al. | |
| 6,146,936 A | 11/2000 | Manning | |
| 6,421,265 B1 * | 7/2002 | Lien et al. | 365/49 |
| 6,512,685 B1 | 1/2003 | Lien et al. | |
| 6,560,156 B2 * | 5/2003 | Lien et al. | 365/222 |
| 6,754,093 B2 * | 6/2004 | Lien | 365/49 |

* cited by examiner

*Primary Examiner*—Gene N. Auduong
(74) *Attorney, Agent, or Firm*—Bever, Hoffman & Harms LLP

(57) ABSTRACT

A CMOS CAM circuit an array of CAMs formed on a p-type substrate. Each CAM cell includes a logic portion and an SRAM cell, both having at least one n-channel transistor formed in a p-type well on the p-type substrate. An n-type doped layer is formed between the p-type well region and the p-substrate. The doped layer and well region are maintained at a voltage potential that is between a threshold voltage and a breakdown voltage defined the PN junction formed at their interface. The resulting structure attracts electron-hole pairs formed by alpha particles, thereby preventing soft errors. Alternatively, the logic portions and SRAM cells have p-channel transistors formed in n-type wells on an n-type substrate, and a p-type doped layer is formed between the n-type well region and the n-substrate.

22 Claims, 4 Drawing Sheets

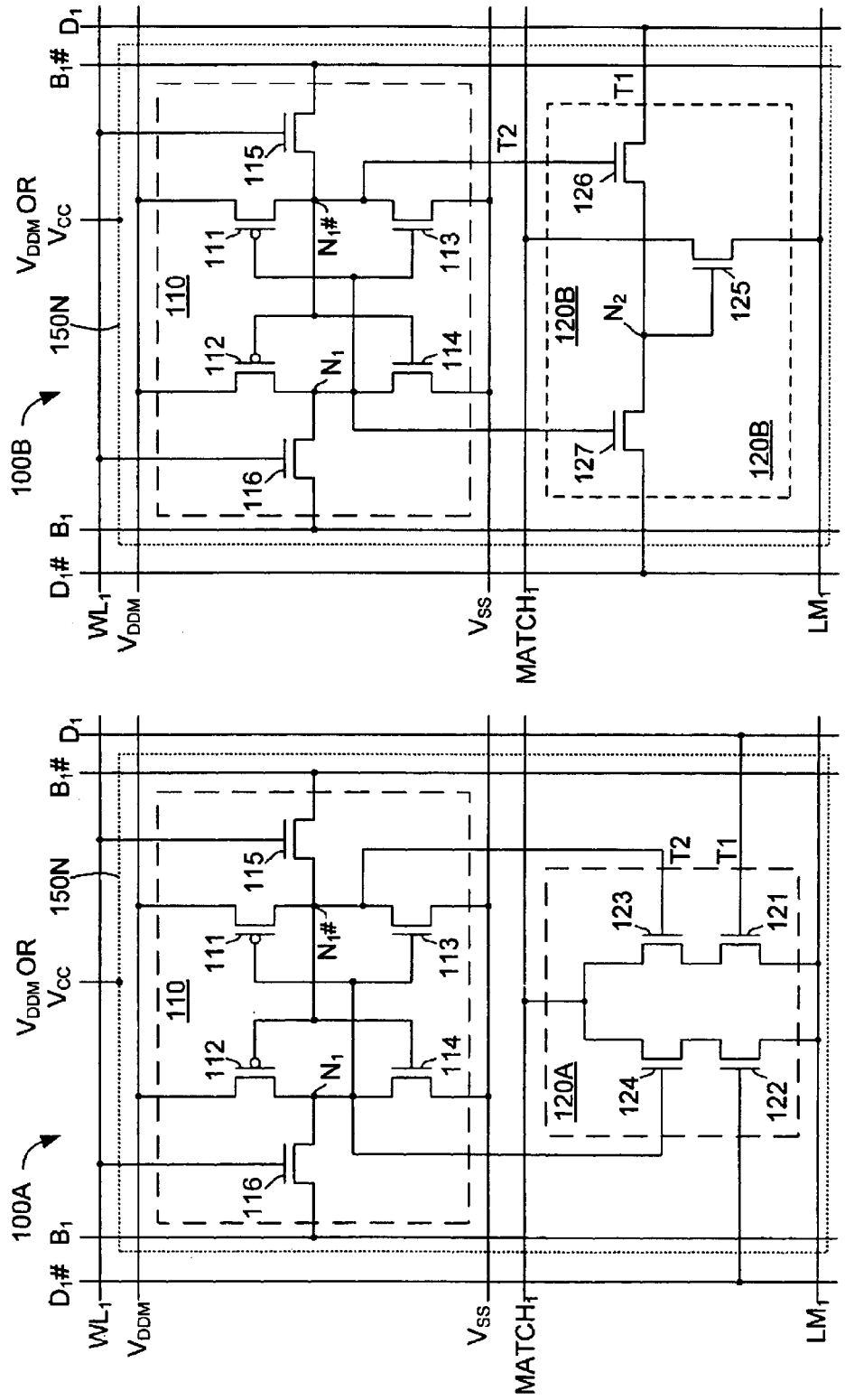

CAM CIRCUIT WITH RADIATION RESISTANCE

CROSS-REFERENCE TO RELATED APPLICATIONS

The present application is a continuation-in-part of U.S. application Ser. No. 10/165,506, which was filed on Jun. 6, 2002 U.S. Pat. No. 6,754,093.

FIELD OF THE INVENTION

The present invention relates to integrated content addressable memory (CAM) arrays, and in particular to low-power CAM arrays.

DISCUSSION OF RELATED ART

Conventional random access memory (RAM) arrays include RAM cells (e.g., static RAM (SRAM) cells, dynamic RAM (DRAM) cells, and non-volatile RAM (NVRAM) cells) that are arranged in rows and columns, and addressing circuitry that accesses a selected row of RAM cells using address data corresponding to the physical address of the RAM cells within the RAM array. A data word is typically written into a RAM array by applying physical address signals to the RAM array input terminals to access a particular group of RAM cells, and applying data word signals to the RAM array input terminals that are written into the accessed group of RAM cells. During a subsequent read operation, the physical address of the group of RAM cells is applied to the RAM array input terminals, causing the RAM array to output the data word stored therein. Groups of data words are typically written to or read from the RAM array one word at a time. Therefore, a relatively small portion of the entire RAM array circuitry is activated at one time to perform each data word read/write operation, so a relatively small amount of switching noise occurs within the RAM array, and the amount of power required to operate the RAM array is relatively small.

In contrast to RAM arrays, content addressable memory (CAM) arrays store data values that are accessed in response to their content, rather than by a physical address. Specifically, during compare (search) operations, a CAM array receives a searched-for data value that is simultaneously compared with all of the data words stored in the CAM array. In response to each searched-for data value applied to the CAM array input terminals, the rows of CAM cells within the CAM array assert or de-assert associated match signals indicating whether or not one or more data values stored in the CAM cell rows match the applied data value. Therefore, large amounts of data can be searched simultaneously, so CAM arrays are often much faster than RAM arrays in performing certain functions, such as search engines.

While CAM arrays are faster than RAM arrays in performing search functions, they consume significantly more power and generate significantly more switching noise than RAM arrays. In particular, in contrast to RAM arrays in which only a small portion of the total circuitry is accessed during each read and write operation, significantly more power is needed (and noise is generated) in a CAM array because, during compare (search) operations, all of the CAM cells are accessed simultaneously, and those CAM cells that do not match the applied search data value typically switch an associated match line from a high voltage to a low voltage. Switching the large number of match lines at one time consumes a significant amount of power.

To reduce the total power consumed by CAM arrays, there is a trend toward producing CAM arrays that operate on low system (operating) voltages. To facilitate lower system voltages, the integrated circuit (IC) fabrication technologies selected to produce such CAM arrays utilize smaller and smaller feature sizes. In general, the smaller the feature size of an IC, the lower the operating voltage that is used to operate the IC. However, when IC feature sizes and operating voltages are reduced too much, the amount of charge stored at each node within the CAM array becomes so small that a "soft error" problem arises, which is discussed below with reference to FIG. 1.

FIG. 1 is a simplified cross sectional view showing an exemplary IC feature (e.g., a drain junction utilized to form an n-type transistor) that comprises an n-type diffusion (node) 50 formed in p-type well (P-WELL) 51, which in turn is formed in a p-type substrate (or deep well region) 52. Dashed line capacitor 53 represents the capacitance of node 50, and indicates that node 50 stores a positive charge.

As indicated in FIG. 1, if an energetic particle, such as an alpha particle (a), from the environment or surrounding structure strikes the n-type diffusion of node 50, then electrons (e) and holes (h) will be generated within the underlying body of semiconductor material (i.e., in p-well 51 or p-type substrate 52). These free electrons and holes travel to the node 50 and p-well 51/p-substrate 52, respectively, thereby creating a short circuit current that reduces the charge stored at node 50. If the energy of the alpha particle is sufficiently strong, or if the capacitance 53 is too small, then node 50 can be effectively discharged. When node 50 forms a drain in an SRAM cell and the charge perturbation is sufficiently large, the stored logic state of the SRAM cell may be reversed (e.g., the SRAM cell can be flipped from storing a logic "1" to a logic "0"). This radiation-produced data change is commonly referred to as a "soft error" because the error is not due to a hardware defect and the cell will operate normally thereafter (although it may contain erroneous data until rewritten).

Many approaches have been proposed for dealing with soft errors, such as increased cell capacitance or operating voltage, and error detection schemes (such as using one or more parity bits). While these proposed approaches are suitable for standard RAM arrays, they are less desirable in CAM arrays. As pointed out above, CAM arrays inherently consume more power than RAM arrays. Therefore, while increased cell size and/or operating voltage can be tolerated in a RAM array, such solutions are less desirable in a CAM arrays. Moreover, adding error detection schemes to CAM arrays increase the size (and, hence, the cost) of the CAM arrays, and further increase power consumption.

Accordingly, what is needed is a CAM circuit that addresses the soft error problem associated with the low power CAM operating environment without greatly increasing the cost and power consumption of the CAM circuit.

SUMMARY

The present invention is directed to a CAM circuit that addresses the soft error problem associated with the low power CAM operating environment by providing a doped layer below both the logic and memory portions of each CAM cell that attracts electrons/holes generated by high energy particles (e.g., alpha particles), thereby reducing the chance of "soft error" discharge without greatly increasing the cost and power consumption of the CAM circuit.

In accordance with a first embodiment of the present invention, each CAM cell of the CAM circuit includes an SRAM cell and a comparator (logic) circuit, wherein both the SRAM cell and the comparator circuit are formed using at least one n-channel transistor having an n-doped storage region (junction node) formed in a p-type well, which in turn is formed in a p-type substrate. In this first embodiment, the n-type doped layer is located directly below the p-type well such that a PN junction is formed between these regions. In one specific embodiment, the n-type doped layer is maintained at a relatively high voltage level and the p-type well is maintained at a relatively low voltage level such that a voltage potential between the n-type doped layer and the p-type well is between a threshold voltage and a breakdown voltage defined by the PN junction. In an alternative embodiment, both the n-type doped layer and the p-type well at a common (e.g., ground or $V_{SS}$) voltage level, thereby maintaining the voltage potential across the PN junction at substantially zero volts. Because the n-type doped layer is formed using a dopant having an opposite conductivity type than that of the well region and substrate, the n-type doped layer attracts electrons generated on either side of its boundary by energetic particles passing through the substrate. Accordingly, fewer electrons gather into the n-doped storage regions forming the transistor junctions of the SRAM cell and comparator circuit of each CAM cell. As a result, each CAM cell has a greater resistance to data corruption than that of conventional CAM structures, thereby facilitating the fabrication of CAM arrays having low operating voltages.

In accordance with a second embodiment of the present invention, the SRAM cell and comparator circuit of each CAM cell are formed using at least one p-channel transistor having an p-doped storage region formed in an n-type well, which in turn is formed in an n-type substrate. In this second embodiment, the p-type doped layer is located directly below the n-type well such that a PN junction is formed between these regions. In one embodiment, the p-type doped layer is maintained at a relatively low voltage level and the n-type well is maintained at a relatively high voltage level such that a voltage potential between the p-type doped layer and the n-type well is between a threshold voltage and a breakdown voltage defined by the PN junction. In an alternative embodiment, both the p-type doped layer and the n-type well at a common (e.g., $V_{CC}$ or other system) voltage level, thereby maintaining the voltage potential across the PN junction at substantially zero volts.

In accordance with a third embodiment of the present invention, each CAM cell of the CAM circuit includes a DRAM cell and a comparator (logic) circuit, wherein both the DRAM cell and the comparator circuit are formed using n-channel transistors having an n-doped storage region (junction node) formed in a p-type well, which in turn is formed in a p-type substrate. In this embodiment, an n-type doped region is formed between the p-type well and the p-type substrate (i.e., below the n-doped storage regions of each n-channel transistor). Alternatively, both the DRAM cell and the comparator circuit are formed using p-channel transistors having a p-doped storage region (junction node) formed in an n-type well, which in turn is formed in an n-type substrate, and are connected to respective high and low voltage sources in the manner mentioned above. Similar to the SRAM embodiments, each CAM cell has a greater resistance to data corruption than that of conventional CAM structures, thereby facilitating the fabrication of CAM arrays having low operating voltages.

The present invention will be more fully understood in view of the following description and drawings.

BRIEF DESCRIPTION OF THE DRAWINGS

FIG. 5 is a schematic diagram showing a CAM cell of the CAM array shown in FIG. 4 in accordance with a first specific embodiment of the present invention;

FIG. 6 is a schematic diagram showing a CAM cell of the CAM array shown in FIG. 4 in accordance with a second specific embodiment of the present invention;

DETAILED DESCRIPTION

The present invention is described below with specific reference to binary SRAM CAM cells and ternary DRAM CAM cells. However, it is noted that the present invention can be extended to include other types of CAM cells, including ternary and quad (four-state) SRAM CAM cells, as well as binary DRAM CAM cells. Further, the specific CAM cell embodiments described herein are intended to be exemplary, and not limiting (unless otherwise specified in the claims).

Figure 2:
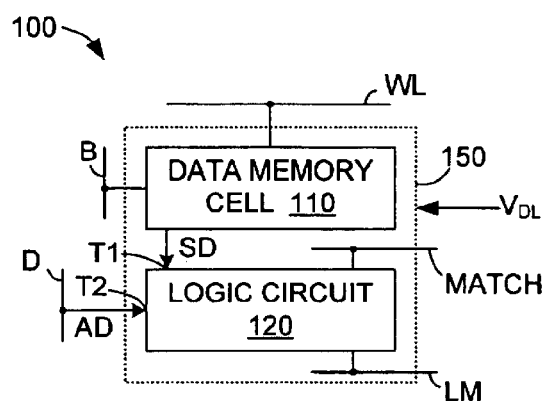
FIG. 2 is a block diagram showing a CAM cell in accordance with the present invention.

FIG. 2 is a block diagram showing a simplified CAM cell 100 in accordance with the present invention. CAM cell 100 includes a data memory cell 110 and a comparator (logic) circuit 120 that are fabricated using CMOS techniques. In one embodiment, both data memory cell 110 and comparator circuit 120 are formed using at least one n-channel transistor having an n-doped storage region (junctions) formed in a p-type well, which in turn is formed in a p-type substrate (or in a larger p-type region formed in an n-type substrate). In another embodiment, both data memory cell 110 and comparator circuit 120 are formed using at least one p-channel transistor having a p-doped storage region formed in an n-type well, which in turn is formed in an n-type substrate (or in a larger n-type region formed in a p-type substrate). CAM cell 100 operates in the manner described below.

In accordance with an aspect of the present invention, a doped layer 150 is formed under data memory cell 110 and logic circuit 120, where the doped layer 150 has a conductivity type that is opposite that of the well region and substrate (or deep well region) on which the transistors of data memory cell 110 and logic circuit 120 are formed. For example, when data memory cell 110 and logic circuit 120 include n-channel transistors having n-doped storage regions formed in p-type wells on p-type substrates, doped layer 150 is formed using n-type dopant material. Conversely, when data memory cell 110 and logic circuit 120 include p-channel transistors having p-doped storage regions formed in n-type wells on n-type substrates, doped layer 150 is formed using p-type dopant material. In accordance with another aspect of the present invention, as indicated in FIG. 2, a voltage potential $V_{DP}$ is applied to doped layer 150 such that a potential across the PN junction separating doped layer 150 and the overlying well region is between a threshold (forward turn on) voltage and a breakdown (reverse bias) voltage defined by the PN junction. Because doped layer 150 has an opposite conductivity type to that of the well region, and by maintaining the voltage potential between the doped layer and well region in this range, doped layer 150 attracts electron/hole pairs on either side of its boundary so that fewer hole pairs gather into the doped storage regions forming the transistor junctions of data memory cell 110 and logic circuit 120. As a result, CAM cell 100 has a greater resistance to data corruption than that of conventional CAM structures, thereby facilitating the fabrication of CAM arrays having low operating voltages.

Figure 1:
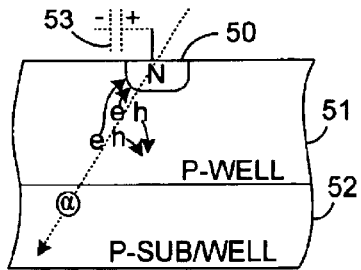
FIG. 1 is simplified cross sectional view showing a node of an IC device.
Figure 3A:
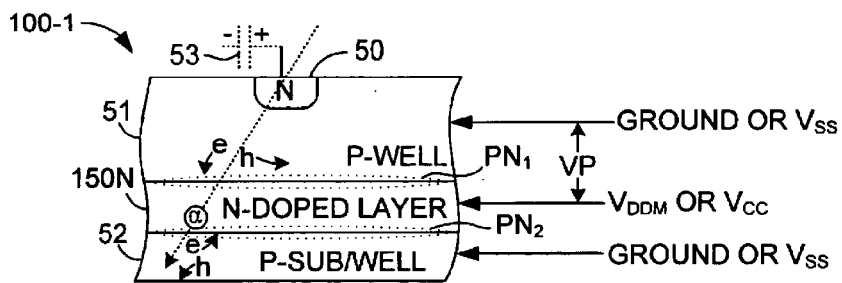
FIGS. 3(A) and 3(B) are a simplified cross sectional views showing portions of the CAM cell shown in FIG. 2 according to alternative first and second embodiments of the present invention.

FIG. 3(A) is a cross-sectional view showing a portion of a CAM cell 100-1, which is consistent with CAM cell 100 of FIG. 1, and formed in accordance with an embodiment of the present invention. Similar to conventional n-channel transistor structures, such as that described above with reference to FIG. 1, each n-channel transistor of CAM cell 100-1 includes an n-doped storage region (junction node) 50 formed in a p-type well (P-WELL) 51, which in turn is formed on a p-type substrate/well region (P-SUB/WELL) 52. In this embodiment, an n-type doped layer (N-DOPED LAYER) 150N is formed using an n-type dopant according to known deep-well formation techniques such that doped layer 150N is located between p-type well 51 and p-type substrate/well 52, and below n-doped storage region 50. Similar to the example described with reference to FIG. 1, dashed line capacitor 53 represents the capacitance of junction 50, and indicates that node 50 stores a positive charge.

Referring to the left side of FIG. 3(A), p-type well 51 and n-type doped layer 150N are connected to associated voltage sources such that a voltage potential VP across a PN junction $PN_1$ is between the threshold voltage and the breakdown voltage defined by PN junction $PN_1$. In the disclosed embodiment, voltage potential VP is formed by connecting p-type well 51 to a low (first) voltage source (e.g., ground or $V_{SS}$), and connecting n-type doped layer 150N to a high (second) voltage source, such as the memory $V_{DD}$ ($V_{DDM}$), if used, or another suitable system voltage source, such as $V_{CC}$. As also indicated on the left side of FIG. 3(A), p-type substrate/well 52 is maintained at a low voltage level (e.g., ground or $V_{SS}$, but not necessarily the same as the potential applied to p-type well 51), thereby maintaining a second voltage potential across the PN junction $PN_2$ separating these regions between the threshold voltage and the breakdown voltage defined by PN junction $PN_2$. In an alternative embodiment (not shown), both p-type well 51 and n-type doped layer 150N are connected to a common voltage source (e.g., ground or $V_{SS}$), thereby maintaining voltage potential VP at substantially zero volts.

As indicated in FIG. 3(A), if an energetic particle, such as an alpha particle (a), from the environment or surrounding structure strikes the n-type diffusion of junction node 50, then electrons (e) and holes (h) will be generated within the underlying body of semiconductor material (e.g., in P-well 51 or p-type substrate 52). However, unlike the conventional structure described above with reference to FIG. 1, many of these free electrons and holes travel to doped layer 150N and P-well 51/P-substrate 52, respectively, thereby reducing the chance of a short circuit current that reduces the charge stored at junction node 50. Therefore, when node 50 forms a drain in an SRAM cell of CAM cell 100-1, the stored logic state of the SRAM cell is not subjected to "soft errors".

Figure 3B:
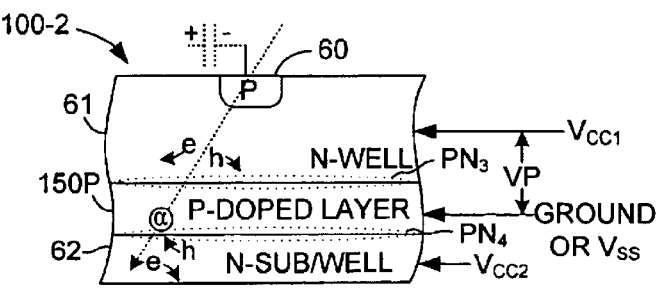

FIG. 3(B) is a cross-sectional view showing a portion of a CAM cell 100-2, which is also consistent with CAM cell 100 of FIG. 1, and formed in accordance with another embodiment of the present invention. Similar to the n-channel transistors structure described above, each p-channel transistor of CAM cell 100-2 includes a p-doped storage region (junction node) 60 formed in an n-type well (N-WELL) 61, which in turn is formed over an n-type substrate/well region (N-SUB/WELL) 62. In this embodiment, a p-type layer (P-DOPED LAYER) 150P is formed using a p-type dopant according to known deep-well formation techniques such that doped layer 150P is located between n-type well region 61 and n-type substrate/well 62. Referring to the left side of FIG. 3(B), n-type well 61 and p-type doped layer 150P are respectively connected to a relatively high voltage source ($V_{CC1}$) and to a relatively low voltage source (ground/$V_{SS}$) such that a voltage potential VP across a PN junction $PN_3$ is between the threshold voltage and the breakdown voltage defined by PN junction $PN_3$. As also indicated on the left side of FIG. 3(B), n-type substrate/well 62 is connected to voltage sources $V_{CC2}$, which may be the same low voltage as $V_{CC1}$, thereby maintaining a second voltage potential across the PN junction $PN_4$ between the threshold voltage and the breakdown voltage defined by PN junction $PN_4$. In an alternative embodiment (not shown), both n-type well region 61 and p-type doped layer 150P are connected to a common voltage source (e.g., $V_{CC1}$), thereby maintaining voltage potential VP at substantially zero volts. As indicated in FIG. 3(B), by introducing doped layer 150P into CAM cell 100-2, if an energetic alpha-particle (α) strikes the p-type diffusion of node 60, then many of these free holes and electrons travel to doped layer 150P and n-well 61/n-substrate 62, respectively, thereby reducing the chance of a short circuit current. Therefore, similar to the embodiment discussed above with reference to FIG. 3(A), when node 60 forms a drain in an SRAM cell of CAM cell 100-2, the stored logic state of the SRAM cell is not subjected to "soft errors".

The operation of CAM cells formed in accordance with the present invention will now be discussed in additional detail.

Referring again to FIG. 2, SRAM data memory cell 100 is controlled by a word line WL to store a data value transmitted on bit line B, and transmits this stored data (SD) value to a first terminal T1 of comparator circuit 120. Comparator circuit 120 also receives an applied data (AD) value at a second terminal T2 from an external data line D. Comparator circuit 120 is controlled by stored data value SD and applied data value AD to open or close a charge/discharge path extending between a match line MATCH and a charge/discharge line LM. For example, when stored data value SD and applied data value AD are not equal (a no-match condition), comparator circuit 120 opens the charge/discharge path, thereby connecting match line MATCH to charge/discharge line LM. Alternatively, when the stored data value and the applied data value are equal (a "match" condition), comparator circuit 120 closes the charge/discharge path, and match line MATCH remains isolated from charge/discharge line LM.

During operation, in accordance with a predefined convention, comparator circuit 120 is controlled by stored data value SD and applied data value AD to maintain a preset voltage level on match line MATCH, or to charge/discharge the match line by opening the charge/discharge path. In an alternative embodiment, match line MATCH may be initially discharged, and charge/discharge line LM is maintained in a high voltage state during a compare operation such that match line MATCH is charged to the high voltage in the event of a match (or no-match) condition. Other alternative embodiments are also possible, such as discharging the match line when a match condition exists, or charging the match line when a no-match condition exists. The present invention is intended to cover all such alternative embodiments.

Figure 4:
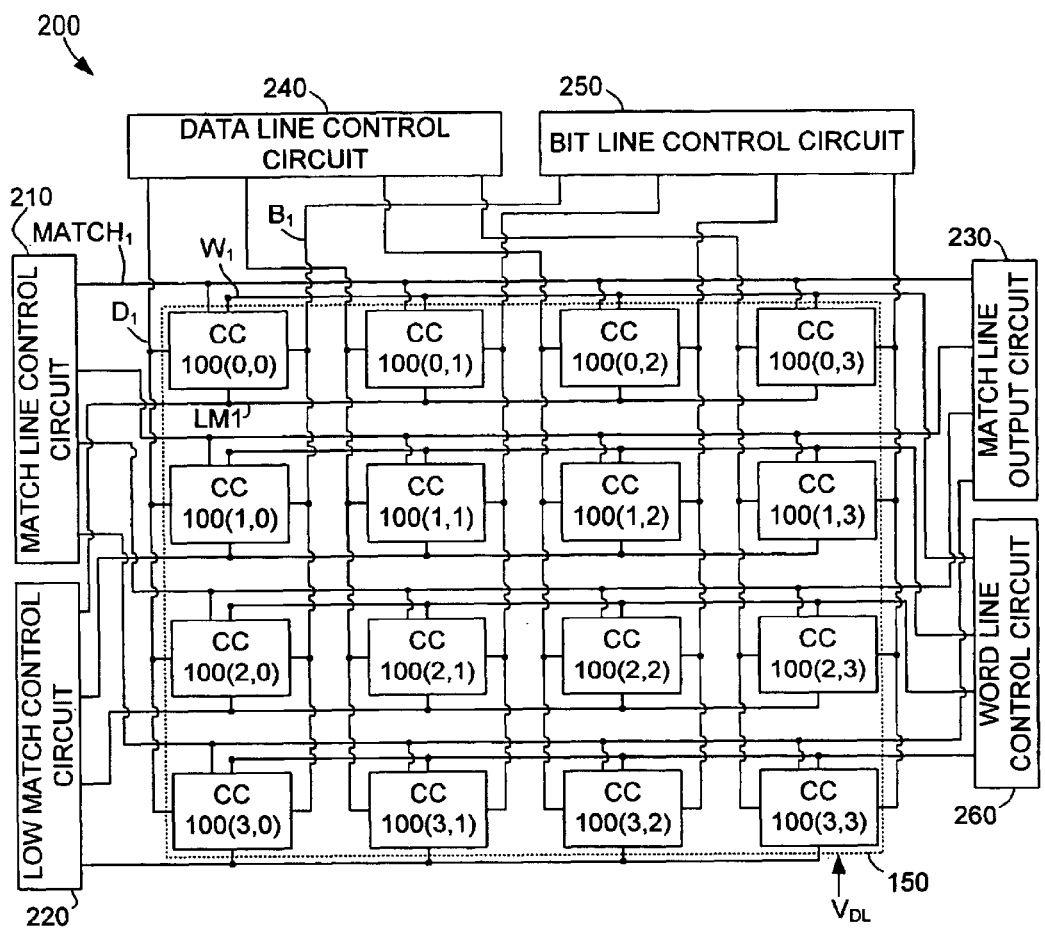
FIG. 4 is a simplified diagram showing a CAM CAM array incorporating the CAM cell of FIG. 2.

FIG. 4 is a simplified schematic diagram showing a CAM cell array 200 including CAM cells (CC) 100(0,0) through 100(3,3) that are arranged in rows and columns. Each CAM cell 100(0,0) through 100(3,3) is essentially identical to CAM cell 100 (see FIG. 2). Each column of CAM cells (e.g., cells 100(0,0) through 100(3,0)) is connected to an associated data line (e.g., data line $D_1$) and an associated bit line (e.g., data line $B_1$). The bit lines are used to transmit data values to the data memory cells (i.e., data memory cell 110; see FIG. 2) of each CAM cell in the associated column during data write operations. The data lines are used to transmit applied data values to the comparison circuit (e.g., comparison circuit 120; see FIG. 2) of each CAM cell in the associated column during comparison operations. Similarly, each row of CAM cells (e.g., cells 100(0,0) through 100(0,3)) is connected to an associated match line (e.g., data line $MATCH_1$), an associated low match (discharge) line (e.g., low match line $LM_1$), and an associated word line (e.g., low match line $W_1$). The word lines are used to address the data memory cells (i.e., data memory cell 110; see FIG. 2) of each CAM cell in the associated row during data write operations. The match line associated with each row of CAM cells is discharged to the associated low match line in the manner described above when any of the CAM cells in the row detect a no-match condition between the applied data value on the associated data line and the stored (first) data value in that CAM cell. Stated differently, when any CAM cell in a given row (e.g., any of CAM cells 100(0,0), 100(0,1), 100(0,2), and 100(0,3)) detects a no-match condition, then the associated match line (e.g., match line $MATCH_1$) is discharged to the associated low match line (e.g., low match line $LM_1$).

In addition to CAM cells 100(0,0) through 100(3,3), CAM cell array 200 includes a match line control circuit 210, a low match control circuit 220, a match line output (sensing) circuit 230, a data line control circuit 240, a bit line control circuit 250, and a word line control circuit 260.

Match line control circuit 210 generates a precharge on each of several match lines (e.g., match line $MATCH_1$) prior to comparison operations. Such match line control functions are well known in the art.

Low match control circuit 220 controls the low match lines (e.g., low match line $LM_1$) such that they float during non-active periods, and are pulled down to a predetermined low voltage (e.g., ground or 0 volts) during compare operations. For example, during a standby operation in which the comparator circuits of the CAM cells connected to low match line $LM_1$ are not active, low match line $LM_1$ is allowed to float. As a result, low match control circuit 220 provides a power savings selectively de-coupling the un-powered low match line $LM_1$. However, during a compare operation, low match line $LM_1$ is maintained at a logic voltage level by low match control circuit 220. As a result, proper voltages required for the compare operation are provided. Note that, while the embodiments described below couple the low match line to the comparator circuit of selected CAM cells, other variations (not shown) may couple the $V_{SS}$ voltage supply source to the comparator instead. However, the resulting CAM cell array will not have the power savings described when using low match control circuit 220.

Match line output circuit 230 senses the charged/discharged state of each match line during compare operations, and passes the resulting match information to associated control circuitry (not shown). Such line sensing functions are well known in the art. Although shown as separate circuits, in an alternative embodiment match line output circuit 230 and match line control circuit 210 can be combined.

Data line control circuit 240, bit line control circuit 250, and word line control circuit 260 perform associated functions using known methods. Data line control circuit 240 transmits applied data signals to selected data lines (e.g., data line $D_1$) during compare operations. Bit line control circuit 250 transmits data signals to selected bit lines (e.g., data line $B_1$) during data write operations. Finally, word line control circuit 260 transmits address signals to selected word lines (e.g., word line $W_1$) during data write operations.

The operation of CAM array 200 is described below with respect to specific embodiments of CAM cell 100. Note that the disclosed specific embodiments are intended to be illustrative, and not limiting.

FIG. 5 is a schematic diagram showing a CAM cell 100A in accordance with a first specific embodiment of the present invention. Similar to CAM cell 100 (see FIG. 2), CAM cell 100A includes an SRAM cell 110 and a comparator circuit 120A that are formed over an n-type doped layer 150N. CAM cell 100A is coupled to bit lines $B_1$ and $B_1\#$ ("#" is used herein to denote an inverted signal), data lines $D_1$ and $D_1\#$, word line $WL_1$, a memory $V_{DD}$ ($V_{DDM}$) voltage supply source, a $V_{SS}$ voltage supply source, low match line $LM_1$, and match line $MATCH_1$. N-type doped layer 150N is preferably connected to the $V_{DDM}$ voltage supply source, but may be connected to another (high) system voltage source (denoted $V_{cc}$).

Referring to the upper portion of FIG. 5, SRAM cell 110 includes p-channel transistors 111 and 112 and n-channel transistors 113-116, which are fabricated as described above. Transistors 111 and 113 are connected in series between a memory voltage $V_{DDM}$ voltage supply source and the $V_{SS}$ voltage supply source, and transistors 112 and 114 are also connected in series between the $V_{DDN}$ voltage supply source and the $V_{SS}$ voltage supply source. Transistors 111 and 113 and transistors 112 and 114 of SRAM cell 110 are cross-coupled to form a storage latch. Specifically, a first storage node $N_1\#$ that is located between transistors 111 and 113 is connected to the gate terminals of transistors 112 and 114, and a second storage node $N_1$ that is located between transistors 112 and 114 is connected to the gate terminals of transistors 111 and 113. Access transistor 115 is connected between bit line $B_1\#$ and node $N_1\#$. Access transistor 116 is connected between bit line $B_1$ and node $N_1$. The gates of access transistors 115 and 116 are connected to word line $WL_1$. Note that SRAM cell 110 only stores a single data value (bit) that is either a logic high value (e.g., a high voltage signal is maintained at node NL and a low voltage signal is maintained at inverted node $N_1\#$), or a logic low value (e.g., a low voltage signal is maintained at node $N_1$ and a high voltage signal is maintained at inverted node $N_1\#$).

Referring now to the lower portion of FIG. 5, comparator circuit 120A includes n-channel transistors 121–124. Transistors 121 and 123 are connected in series between match line $MATCH_1$ and low match line $LM_1$, and transistors 122 and 124 are also connected in series between match line $MATCH_1$ and low match line $LM_1$. The gate terminal of transistor 121 is connected to data line $D_1$, and the gate terminal of transistor 123 is connected to node $N_1\#$. Therefore, transistors 121 and 123 are turned on to open a first path between match line $MATCH_1$ and low match line LM$_1$ only when a high applied data signal transmitted on data line D$_1$ and a high data signal is stored at node N$_1$#. Similarly, the gate terminal of transistor 122 is connected to data line D$_1$#, and the gate terminal of transistor 124 is connected to node N$_1$. Therefore, transistors 122 and 124 are turned on to open a second path between match line MATCH$_1$ and low match line LM$_1$ only when a high applied data signal transmitted on data line D$_1$# and a high data signal is stored at node N$_1$.

Examples of standby, write, read, and compare operations of CAM cell 100A will now be described.

In a standby operation, word line WL$_1$ and data lines D$_1$ and D$_1$# are pulled down to logic low values, thereby turning off transistors 115 and 116, 121, and 122, respectively. The value of match line MATCH$_1$ does not matter and is preferably left in its last state. Under these conditions, SRAM cell 110 latches the values at node N$_1$ and the inverted node N$_1$#.

To write a data value (e.g., a logic high value) to SRAM cell 110, bit line B$_1$ is held to a first data value (e.g., a logic high value) and bit line B$_1$# is held to the inverse of the first write data value (e.g., a logic low value). Data lines D$_1$ and D$_1$# are held to logic low values, thereby turning of transistors 121 and 122, respectively. Turned off transistors 121 and 122 decouple match line MATCH$_1$ from low match line LM$_1$, thereby preventing the write operation from changing the state of match line MATCH$_1$. Word line WL$_1$ is then pulled up to a logic high value to turn on transistors 114 and 115, thereby passing the logic values from bit lines B$_1$ and B$_1$# to the latch formed by transistors 111–114. To write a logic high value to SRAM cell 110, bit line B$_1$ is held to a logic high value (i.e., a first write data value) and bit line B$_1$# is held to a logic low value. Under these conditions, the logic high value of word line WL$_1$ turns on transistors 115 and 116 to couple the logic low value on bit line B$_1$# to node N$_1$# and the logic high value on bit line B$_1$ to node N$_1$, thereby pulling up node N$_1$ to a logic high value and pulling down node N$_1$# to a logic low value. As a result, SRAM cell 110 stores a logic high value. Conversely, to write a logic low value to SRAM cell 110, bit line B$_1$ is held to a logic low value (i.e., a first write data value) and bit line B$_1$# is held to a logic high value. Under these conditions, the logic high value of word line WL$_1$ turns on transistors 115 and 116 to pull up node N$_1$# to a logic high value and node N$_1$ to a logic low value in a manner similar to that described above. As a result, SRAM cell 110 stores a logic low value.

A compare operation of CAM cell 100A will now be described. During a compare operation, match line MATCH$_1$ is pre-charged to a logic high value. Both low match line and word line WL$_1$ are held at logic low values. The value of bit lines B$_1$ and B$_1$# are not utilized in the compare operation, and are therefore left in their previous states. In the present example, a "match" condition is indicated during a compare operation by a high logic value on match line MATCH$_1$, and a no-match condition is indicated during a compare operation by a low logic value on match line MATCH$_1$. Accordingly, in a match condition, match line MATCH$_1$ remains isolated from low match line LM$_1$ by comparator circuit 120A. Conversely, during a no-match condition, match line MATCH$_1$ is coupled to low match line LM$_1$ through comparator circuit 120A.

FIG. 6 is a schematic diagram showing a CAM cell 100B in accordance with a second specific embodiment of the present invention. CAM cell 100A includes SRAM cell 110, which is described above with reference to FIG. 5, and a comparator circuit 120B that operates as described below. Similar to CAM cell 100A (discussed above, SRAM cell 110 and comparator circuit 120B are formed over n-type doped layer 150N, which is connected to the V$_{DDN}$ or V$_{CC}$ voltage sources, as discussed above.

Referring to the lower portion of FIG. 6, comparator circuit 120B includes n-channel transistors 126, 127 and 128. Transistor 128 is connected between match line MATCH$_1$ and low match line LM$_1$. Transistor 126 has a first terminal connected to data line D$_1$, a gate terminal connected to inverted node N$_1$#, and a second terminal connected to a node N$_2$, which is connected to the gate terminal of transistor 128. Accordingly, transistor 128 is turned on during a compare operation to open a discharge path between match line MATCH$_1$ and low match line LM$_1$ when both a high voltage signal is stored at inverted node N$_1$# (which turns on transistor 126), and a high voltage signal is applied to data line D$_1$ (which is passed by turned-on transistor 126). Similarly, transistor 127 has a first terminal connected to inverted data line D$_1$#, a gate terminal connected to node N$_1$, and a second terminal connected to node N$_2$. Accordingly, transistor 128 is also turned on during a compare operation when both a high voltage signal is stored at node N$_1$ (which turns on transistor 127) and a high voltage signal is applied to inverted data line D$_1$# (which is passed by turned-on transistor 127).

Figure 7A:
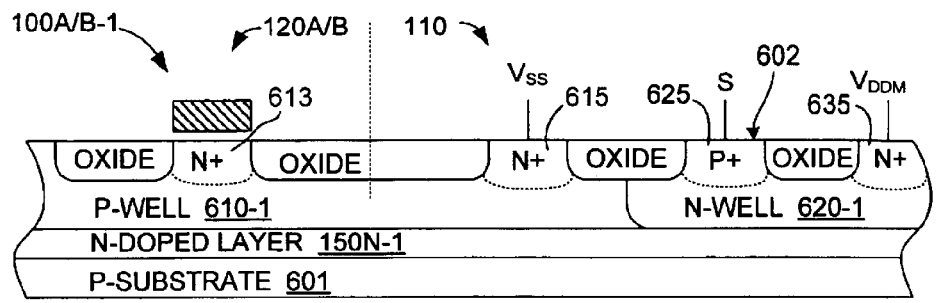
FIGS. 7(A) and 7(B) are simplified cross sectional views showing portions of alternative CAM cells incorporating n-type layers according to further specific embodiments of the present invention.
Figure 7B:
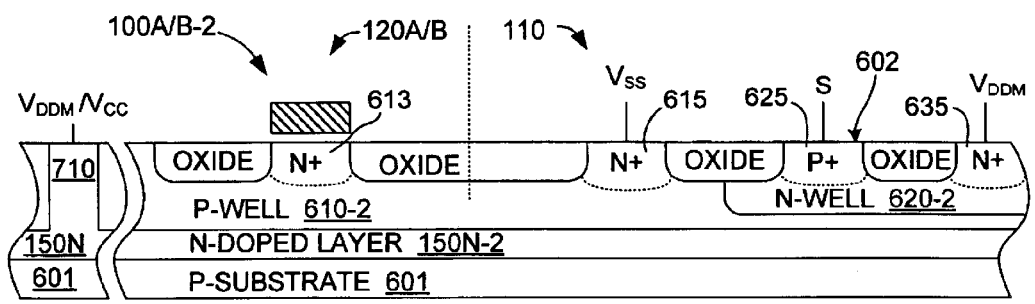

FIGS. 7(A) and 7(B) are simplified cross sectional views showing portions of a CAM cell 100A/B-1 and a CAM cell 100A/B-2, which are consistent with either CAM cell 100A or CAM cell 100B (described above). Referring to FIG. 7(A), CAM cell 100A/B-1 is formed on a p-type substrate (P-SUBSTRATE) 601, and includes a p-type well region (P-WELL) 610-1 having a higher doping concentration (e.g., $10^{17}$ to $10^{18}$ atoms per ccm) than that of p-type substrate 601 (e.g., $10^{15}$ atoms per ccm), and an n-type well region (N-WELL) 620-1 formed according to known techniques. As described above with reference to FIGS. 5 and 6, CAM cell 100A/B-1 includes an SRAM (memory) cell 110 and a comparator circuit 120A/B, which are described above with reference to FIGS. 5 and 6. As described above, comparator circuit 120A/B includes at least one n-channel transistor formed by an n-type diffusion region 613 that is formed in p-type well region 610-1 and has a higher doping concentration (e.g., $10^{20}$ atoms per ccm) than that of p-type well region 610-1. Similarly, memory circuit 110 includes at least one n-channel transistor formed by an n-type diffusion region 615 that is formed in p-type well region 610-1, and at least one p-channel transistor formed by a p-type diffusion region 625 that is formed in n-type well region 620-1, and is controlled by a signal S. In the disclosed embodiment, n-type doped layer 150N-1 has a doping concentration (e.g., $10^{16}$ atoms per ccm or greater) that is greater than that of p-type substrate 601. In addition, n-type well region 620-1 formed between an upper surface 602 of substrate 601 and doped layer 150N-1 such that a lower region of n-type well region 620-1 touches doped layer 150N-1 (i.e., the dopant region forming doped layer 150N-1 is sufficiently close to or overlaps the dopant region forming n-type well region 620-1 such that substantially zero resistance exists between doped layer 150N-1 and n-type well region 620-1). Further, the memory voltage signal V$_{DDM}$ is coupled to doped layer 150N-1 via n-type well region 620-1 and an n-type diffusion region 635.

Referring to FIG. 7(B), CAM cell 100A/B-2 is similar to CAM cell 100A/B-1 (FIG. 7(A)), except that n-well region 620-2 is separated from n-type doped layer 150N-2 by a region of p-well region 610-2 (i.e., such that a significant resistance exists between p-well region 610-2 and n-well region 620-2). In addition, because of the open circuit between n-well region 620-2 and n-type doped layer 150N-2, a separate conductive region 710 (e.g., an n-doped region, a trench structure, or a metal structure) is provided between upper surface 602 and n-type doped layer 150N-2.

Figure 8:
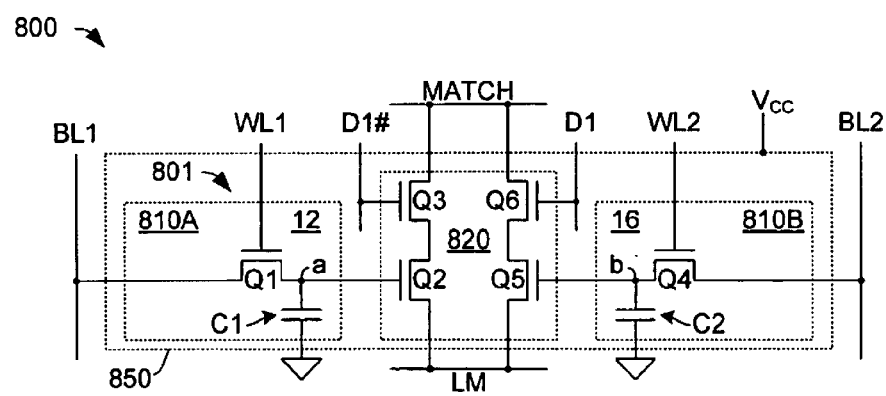
FIG. 8 is a schematic diagram showing a ternary DRAM-based CAM according to another embodiment of the present invention.

FIG. 8 is a schematic diagram showing a portion of a ternary DRAM-based CAM 800 according to a third embodiment of the present invention. CAM circuit 800 includes an array of ternary CAM cells 801 (one shown), each CAM cell 801 including a first one-transistor (1T) DRAM cell 810A, a second 1T DRAM cell 810B, and a logic circuit 820 made up of transistors Q2 through Q6. DRAM cell 810A includes transistor Q1 and a capacitor structure C1, which combine to form a storage node a that receives a data value from bit line BL1 during write operations, and applies the stored data value to the gate terminal of transistor Q2 of comparator circuit 820. Transistor Q2 is connected in series with transistor Q3, which is controlled by a data signal transmitted on inverted data line D1#, between a match line MATCH and a discharge line LM. DRAM cell 810B includes transistor Q3 and a capacitor structure C2, which combine to form a storage node b that receives a data value from bit line BL2, and applies the stored data value to the gate terminal of transistor Q4 of comparator circuit 820. Transistor Q4 is connected in series with transistor Q5, which is controlled by a data signal transmitted on inverted data line D1#, between the match line and the discharge line. The operation of CAM cell 801 is similar to that described above, with the exception that a "don't care" state is stored when both DRAM cells 810A and 810B store logic low data values, thereby preventing discharge of the match line no matter what data values are transmitted on data lines D1 and D1#.

In accordance with the present invention, transistors Q1 through Q6 of CAM cell 801 are formed over a doped region 850 that is similar to n-doped layer 150N-1 shown in FIG. 7(A), and coupled to a system voltage source $V_{CC}$. In particular, transistors Q1 through Q6, which form DRAM cells 810A and 810B and comparator 820, are all n-channel transistors formed by an n-type diffusion region that is formed in p-type well region, which in turn is formed over a p-type substrate, similar to the structure shown in FIG. 7(A). In accordance with the third embodiment, all six transistors (i.e., both the memory and the logic portions of CAM cell 810) are formed over n-type doped region 850, which is located between the p-type well region and the p-substrate. In an alternative embodiment, transistors Q1 through Q6 are all p-channel transistors formed by an p-type diffusion region that is formed in n-type well region, which in turn is formed over a n-type substrate, and doped region 850 is formed using a p-type dopant.

Although the present invention is described with reference to binary SRAM CAM cells and ternary DRAM CAM cells, those of ordinary skill in the art will recognize that the present invention can be extended to include ternary and quad (four-state) SRAM CAM cells, and binary and quad DRAM CAM cells. Further, In view of these and other possible modifications, the invention is limited only by the following claims.

What is claimed is:

1. A content addressable memory (CAM) circuit comprising a plurality of CAM cells, each CAM cell including a memory cell and a logic circuit formed on a substrate,
    wherein both the memory cell and the logic circuit include a well region having a first conductivity type and at least one transistor including a diffusion region of a second conductivity type formed in the well region, and
    wherein the CAM circuit comprises a doped layer formed in the substrate under the well region below both the memory cell and the logic circuit, the doped layer including a dopant of the second conductivity type such that a PN junction is defined between the doped layer and the well region, and
    means for maintaining a voltage potential between the doped layer and the well region such that the voltage potential is between a threshold voltage and a breakdown voltage defined by the PN junction.

2. The CAM circuit according to claim 1, wherein the first conductivity type comprises p-type dopant and the second conductivity type comprises n-type dopant, and
    wherein said means comprises a first voltage source for maintaining the well region at a first, relatively low voltage level, and a second voltage source for maintaining the doped layer at a second, relatively high voltage level.

3. The CAM circuit according to claim 2, wherein the first voltage source comprises a system ground source, and wherein the second voltage source comprises a system voltage source that is also coupled to the memory cell.

4. The CAM circuit according to claim 2, further comprising an n-type well region formed between a surface of the substrate and the doped layer such that a lower end of the n-type well region touches the doped layer,
    wherein the second voltage source is coupled to the doped layer through the n-type well region.

5. The CAM circuit according to claim 2, further comprising a conductive region extending between a surface of the substrate and the doped layer such that a lower end of the conductive region contacts the doped layer,
    wherein the second voltage source is coupled to the doped layer through the conductive region.

6. The CAM circuit according to claim 5, wherein the conductive region comprises one of an n-doped region, a trench structure, and a metal structure.

7. The CAM circuit according to claim 1,
    wherein the first conductivity type comprises n-type dopant and the second conductivity type comprises p-type dopant, and
    wherein said means comprises a first voltage source for maintaining the well region at a first, relatively high voltage level, and a second voltage source for maintaining the doped layer at a second, relatively low voltage level.

8. The CAM circuit according to claim 1,
    wherein the memory cell is a static random access memory (SRAM) cell including a p-channel transistor having a junction node formed by a p-type diffusion region formed in an n-type well region, and a first n-channel transistor having a junction node formed by a first n-type diffusion region formed in a p-type well region,
    wherein the logic circuit comprises a second n-channel transistor having a junction node formed by a second n-type diffusion region formed in the p-type well region, and
    wherein the doped layer comprises n-type dopant extending under the p-type well region below both the first and second n-type diffusion regions.

9. The CAM circuit according to claim 8,
    wherein the n-type well region touches the doped layer, and
    wherein a system voltage source is coupled to the doped layer through the n-type well region.

10. The CAM circuit according to claim 8, further comprising a conductive region extending between a surface of the substrate and the doped layer such that a lower end of the conductive region touches the doped layer,
wherein a system voltage source is coupled to the doped layer through the conductive region.

11. The CAM circuit according to claim 1, wherein the doped layer has a dopant concentration that is greater than a dopant concentration of the substrate.

12. The CAM circuit according to claim 1,
wherein the memory cell comprises a dynamic random access memory (DRAM) cell including a first n-channel transistor connected between a first bit line and a storage node, and
wherein the logic circuit comprises a second n-channel transistor having a gate terminal connected to the storage node of the DRAM cell, and a third n-channel transistor connected in series with the second n-channel transistor and having a gate terminal connected to receive the applied data value.

13. The CAM circuit according to claim 1, wherein said means comprises means for maintaining both the doped layer and the well region at a common voltage level such that the voltage potential is substantially zero volts.

14. A content addressable memory (CAM) circuit fabricated on a p-type substrate having a p-type well region formed thereon, wherein the CAM circuit comprises:
a plurality of CAM cells, each CAM cell including a memory cell having a first n-doped storage region formed in the p-type well region, and a logic circuit including a second n-doped storage region formed in the p-type well;
an n-type doped layer formed under the p-type well region; and
means for maintaining a first voltage level on the n-type doped layer and a second voltage level on the p-type well region such that a voltage potential between the n-type doped layer and the p-type well region is between a threshold voltage and a breakdown voltage associated with a PN junction formed between the n-type doped layer and the p-type well region.

15. The CAM circuit according to claim 14, further comprising an n-type well region formed adjacent to the p-type well region,
wherein the memory cell includes a p-channel transistor including a p-doped storage region formed in the n-type well region, and
wherein the n-type doped layer extends under the n-type well region.

16. The CAM circuit according to claim 15,
wherein the n-type well region touches the n-type doped layer, and
wherein a system voltage source is coupled to the n-type doped layer through the n-type well region.

17. The CAM circuit according to claim 15, further comprising a conductive region extending between a surface of the p-type substrate and the n-type doped layer such that a lower end of the conductive region touches the n-type doped layer,
wherein a system voltage source is coupled to the n-type doped layer through the conductive region.

18. The CAM circuit according to claim 17, wherein the conductive region comprises one of an n-doped region, a trench structure, and a metal structure.

19. The CAM circuit according to claim 14,
wherein the memory cell of each CAM cell stores an associated stored data value,
wherein the logic circuit of each CAM cell includes a first control terminal connected to receive the stored data value of the SRAM cell, a second control terminal connected to receive an applied data value, and
wherein the logic circuit of each CAM cell is arranges such that, during a compare operation, the logic circuit selectively opens a path between a match line and a discharge line when the applied data value fails to match the stored data value.

20. The CAM circuit according to claim 19, wherein the memory cell comprises a static random access memory (SRAM) cell including:
a first p-channel transistor connected between a first voltage source and the second node, the first p-channel transistor having a gate terminal connected to the first node;
a second p-channel transistor connected between the first voltage source and the first node, the second p-channel transistor having a gate terminal connected to the second node;
a first n-channel transistor connected between a second voltage source and the second node, the first n-channel transistor having a gate terminal connected to the first node;
a second n-channel transistor connected between the second voltage source and the first node, the second n-channel transistor having a gate terminal connected to the second node;
a first access transistor connected between a first data line and the first node, the first pass transistor having a gate terminal connected to a word line; and
a second access transistor connected between a second data line and the second node, the second pass transistor having a gate terminal connected to the word line.

21. The CAM circuit according to claim 14,
wherein the memory cell comprises a dynamic random access memory (DRAM) cell including a first n-channel transistor connected between a first bit line and a storage node, and
wherein the logic circuit comprises a second n-channel transistor having a gate terminal connected to the storage node of the DRAM cell, and a third n-channel transistor connected in series with the second n-channel transistor and having a gate terminal connected to receive the applied data value.

22. The CAM circuit according to claim 14, wherein the first voltage level is greater than or equal to the second voltage level.

* * * * *